United States Patent

Iwasaki et al.

Patent Number: 6,080,237
Date of Patent: Jun. 27, 2000

[54] METHOD FOR PRODUCTION OF DISLOCATION-FREE SILICON SINGLE CRYSTAL

[75] Inventors: Toshio Iwasaki, Hikari; Shin-ichi Fujimoto; Hiroshi Isomura, both of Kumage-gun; Takayoshi Ishida, Hikari; Michiharu Tamura, Kumage-gun; Atsushi Ikari, Kawasaki, all of Japan

[73] Assignees: Nippon Steel Corporation; NSC Electron Corporation, both of Tokyo, Japan

[21] Appl. No.: 09/093,179

[22] Filed: Jun. 8, 1998

[30] Foreign Application Priority Data

Jun. 10, 1997 [JP] Japan .................................. 9-152246
May 25, 1998 [JP] Japan ................................ 10-143072

[51] Int. Cl.[7] .................................................. C30B 15/20
[52] U.S. Cl. ................................ 117/13; 117/19; 117/30; 117/32
[58] Field of Search ................................ 117/13, 15, 19, 117/30, 32

[56] References Cited

U.S. PATENT DOCUMENTS

| | | | |
|---|---|---|---|
| 5,126,113 | 6/1992 | Yamagishi et al. | 422/249 |
| 5,628,823 | 5/1997 | Chandrasekhar et al. | 117/15 |
| 5,885,344 | 3/1999 | Kim et al. | 117/13 |
| 5,911,822 | 6/1999 | Abe et al. | 117/13 |
| 5,916,364 | 6/1999 | Izumi | 117/13 |

FOREIGN PATENT DOCUMENTS

0747512  12/1996  European Pat. Off. .
5-43379   2/1993  Japan .

OTHER PUBLICATIONS

ABE, "Innovated Silicon Crystal Growth and Wafering Technologies", Electrochemical Society Proceedings vol. 97–3, pp. 123–133.

*Primary Examiner*—Felisa Hiteshew
*Attorney, Agent, or Firm*—Wenderoth, Lind & Ponack, LLP

[57] ABSTRACT

This invention is directed to a method for the production of a dislocation-free silicon single crystal by the Czochralski method. This method attains growth of the main body part of the dislocation-free silicon single crystal by immersing a seed crystal in a melt of silicon and then pulling the seed crystal without recourse to the necking. The seed crystal thus used is a dislocation-free silicon single crystal. The horizontal maximum length of the part of the seed crystal being immersed in the melt at the time of completing the immersion of the seed crystal in the melt is not less than 5 mm. The immersing rate of the seed crystal in the melt is not more than 2.8 mm/min and the part of the seed crystal to be immersed in the melt is a crystal as grown.

13 Claims, 3 Drawing Sheets

30mm, 10mm, 120°

25mm, 10mm, 85°

25mm, 10mm, 85°

METHOD FOR PRODUCTION OF DISLOCATION-FREE SILICON SINGLE CRYSTAL

BACKGROUND OF THE INVENTION

1. Field of the Invention

This invention relates to a method for the production of a dislocation-free silicon single crystal by the Czochralski method. More particularly, it relates to a method for the production of a dislocation-free silicon single crystal without requiring a necking operation by the Dash method.

2. Description of Related Art

The production of a dislocation-free silicon single crystal by the Czochralski method (hereinafter referred to as "CZ method") comprises placing and melting polycrystalline silicon in a crucible, immersing a seed crystal in the melt, and pulling the seed crystal and inducing growth of a single crystal. In the production of the single crystal by this CZ method, when the seed crystal is immersed in the melt at the most initial stage of the production, this seed crystal is caused to develop dislocation therein owing to the thermal shock (thermal stress) originating in the contact with the melt. The silicon single crystal to be grown thereafter transforms into a dislocated crystal unless the seed crystal is deprived of this dislocation.

The Dash method has been heretofore available as a means for expelling the dislocation generated in the seed crystal. The Dash method effects perfect removal of the dislocation from the crystal before the main body part of crystal starts growing by performing the operation of necking for decreasing the diameter of the crystal as by causing the neck part thereof, 2–4 mm in diameter, to grow at a high pulling speed in the proximity of 6 mm/min. This operation is referred to as "Dash's neck."

After the dislocation has been removed from the neck part, the main body part of crystal has the diameter thereof enlarged until a prescribed size. Thereafter, the main body part of a prescribed length is left growing, then contracted in diameter to form a tail part, and severed from the melt. The produced crystal is extracted from the pulling device.

In the method for producing the silicon single crystal by resorting to the Dash's neck operation described above, since the weight of the grown single crystal is supported by the neck part which has the weakest strength in the whole single crystal ingot continuing growth, it sometimes occurs that the neck part will accidentally break while the growth of crystal is in process and the main body part of crystal will consequently fall down into the crucible holding the melt.

With a view to curbing the occurrence of this accident, JP-A-05043379 discloses a method which comprises forming a neck part larger in diameter than the neck part which would be formed by the Dash method and meanwhile depriving the grown crystal of dislocation. By this method, the neck part is pulled at a rate in the range of 4–6 mm/min and the removal of dislocation is effected when the neck part maintains a fixed diameter in the range of 4.5–10 mm. The removal of the dislocation becomes difficult when the diameter of the neck part exceeds 10 mm.

EP-A-0747512 discloses a method which comprises causing the middle portion and the lower portion of the neck part exceeding 10 mm in diameter to grow at a rate of less than bout 4.0 mm/min until the dislocation is removed. Though this method is effective for the $p^+$-type silicon single crystal whose resistivity due to doping with boron does not exceed 0.1 Ω.cm, it is not effective for the standard $p^-$-type crystal or n-type crystal.

U.S. Pat. No. 5,126,113 discloses a technique for preventing the neck part from breakage by additionally providing a holding means for use in the main body part of crystal. By this technique, after the dislocation in the crystal has been removed by the Dash's neck and before the cone portion of the main body part of crystal subsequently starts growing, the crystal is provided in the lower side of the Dash's neck part with a bulge by increasing the diameter. During the growth of the main body part of crystal, a mechanical grip takes hold of the depressed portion below the bulged portion to support the main body part of crystal. In the case of this technique, the grip has the possibility of inflicting breakage on the Dash's neck part while in the process of taking hold of the crystal.

Electrochemical Society Proceedings, Vol. 97-3, p. 123 proposed a dislocation-free seed technique which avoids the Dash's neck in a diameter of 10 mm. This technique attains growth of a dislocation-free silicon single crystal by immersing a silicon seed crystal which is formed of a dislocation-free silicon single crystal having the leading end thereof pointed after the fashion of a pencil and measuring 10 mm in diameter and which has a surface free from scratch or contamination, into the melt at a rate of 3 mm/min to a prescribed length and thereafter enlarging the diameter of crystal to form the main body part of crystal without resorting to the Dash's neck. The dislocation-free silicon single crystal is not necessarily obtained based solely on the conditions which are proper for this technique. Not only the scratch and contamination of the surface but also the surface roughness has serious effect on the generation of dislocation. When the surface roughness is large, the rugged portion of the surface concentrates stress and generates dislocation consequently. Therefore, even when the seed crystal to be used is shaped like a pencil and is free of scratch or contamination and it is immersed at a rate of 3.0 mm/min as expected by this technique, it will generate dislocation if it has a large surface roughness.

When an attempt is made to obtain the dislocation-free silicon single crystal by using the rate of 3.0 mm/min for the immersion of the seed crystal as specified for this technique, this immersion must be carried out in a specific hot zone (furnace interior structure) and the elimination of dislocation is not easily attained in a rather suddenly cooling type furnace interior structure having a temperature gradient of not less than 5.0° C./mm in the solid-liquid interface between the melt and the crystal, for example.

SUMMARY OF THE INVENTION

It is an object of this invention to provide a method for the production of a dislocation-free silicon single crystal by the CZ method, which allows manufacture of a dislocation-free silicon single crystal of a large diameter and a large weight to be attained safely with fine repeatability while preventing the occurrence of the accident of the fall of a grown crystal due to the breakage of the neck part under heavy weight.

According to an aspect of the invention, it is a method for the production of a dislocation-free silicon single crystal by the Czochralski method, which allows growth of the main body part of the dislocation-free silicon single crystal by immersing a seed crystal formed of dislocation-free silicon single crystal in a melt of silicon and thereafter pulling the seed crystal without recourse to the necking, which production is effected under the following conditions:

(a) the horizontal maximum length of the part of the seed crystal being immersed in the melt of silicon at the time of completion of the immersion was not less than 5 mm, (b) the part of the seed crystal to be immersed in the melt of silicon have been shaped by the machining, and (c) at least any one condition selected from the group consisting of the following conditions (c1) through (c6) be satisfied, (c1) the leading end of the part of the seed crystal to be immersed in the melt of silicon be convexed downward, (c2) the Rmax value of surface roughness of the part of the seed crystal to be immersed in the melt of silicon be not more than 5 μm, based on the reference length of 0.1 mm, (c3) the part of the seed crystal to be immersed in the melt of silicon have been etched, (c4) the concentration of a dopant contained in the seed crystal be not less than $1 \times 10^{17}$ cm$^{-3}$, (c5) the immersing rate of the seed crystal in the melt of silicon be not more than 2.8 mm/min, and (c6) the temperature gradient occurring in the seed crystal be not more than 10° C./mm during the growth of the silicon single crystal.

According to another aspect of the invention, it is a method for the production of a dislocation-free silicon single crystal by the Czochralski method, which allows growth of the main body part of the dislocation-free silicon single crystal by immersing a seed crystal formed of dislocation-free silicon single crystal in a melt of silicon and thereafter pulling the seed crystal without recourse to the necking, which production is effected under the following conditions:

(a) the horizontal maximum length of the part of the seed crystal being immersed in the melt of silicon at the time of completion of the immersion be not less than 5 mm, and (b) at least any one condition selected from the group consisting of the following conditions (b1) through (b6) be satisfied, (b1) the part of the seed crystal to be immersed in the melt of silicon be as grown, (b2) the leading end of the part of the seed crystal to be immersed in the melt of silicon be convexed downward, (b3) the Rmax value of surface roughness of the part of the seed crystal to be immersed in the melt of silicon be not more than 5 μm, based on the reference length of 0.1 mm, (b4) the concentration of a dopant contained in the seed crystal be not less than $1 \times 10^{17}$ cm$^{-3}$, (b5) the immersing rate of the seed crystal in the melt of silicon be not more than 2.8 mm/min, and (b6) the temperature gradient occurring in the seed crystal be not more than 10° C./mm during the growth of the silicon single crystal.

DESCRIPTION OF THE PREFERRED EMBODIMENTS

Figure 1:
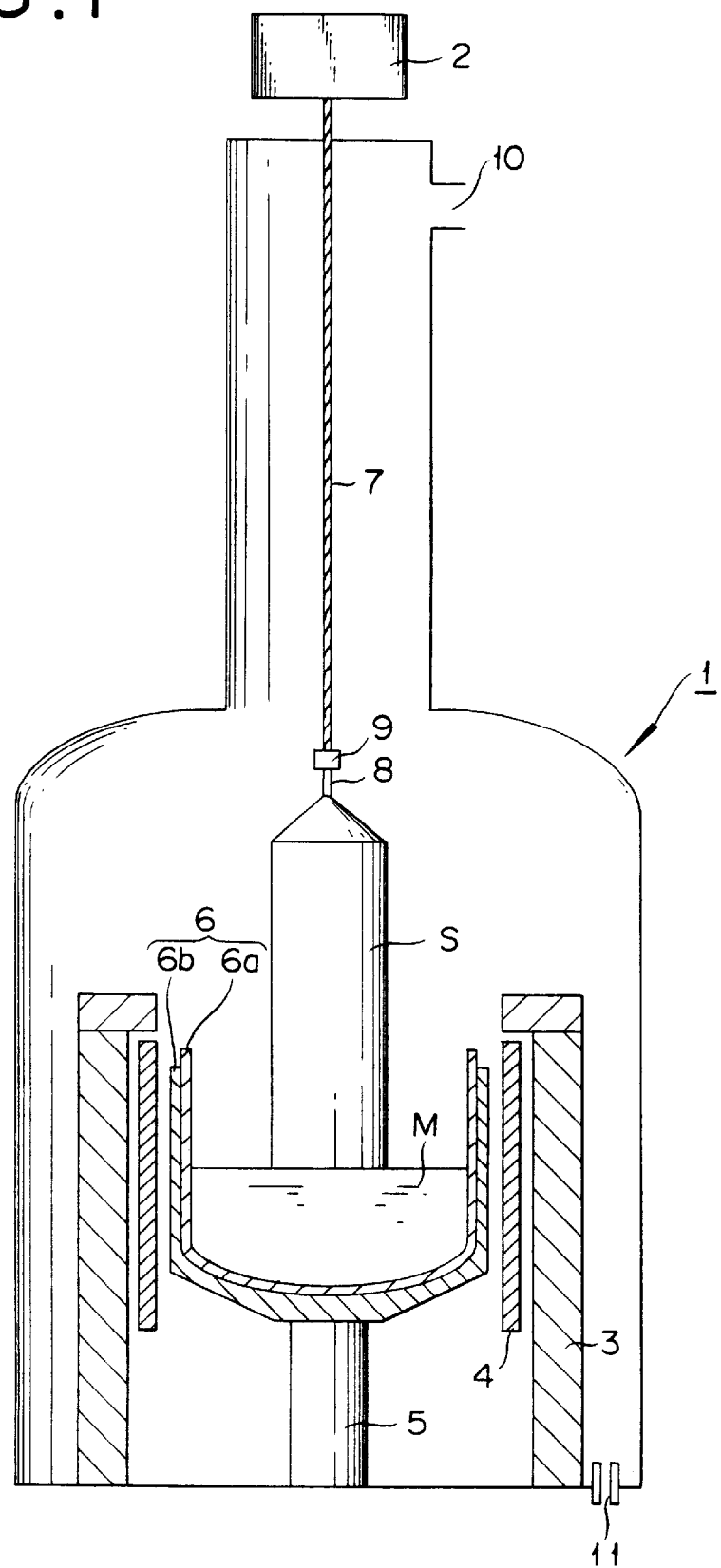
FIG. 1 is a schematic diagram of an apparatus for the production of a dislocation-free silicon single crystal in accordance with the CZ method.

This invention is directed to a method for growing the main body part of a dislocation-free silicon single crystal by immersing a seed crystal formed of dislocation-free silicon single crystal in a melt of silicon, causing the part of the seed crystal being immersed in the melt of silicon at the time of completion of the immersion to acquire a horizontal maximum length of not less than 5 mm, and thereafter pulling the seed crystal without recourse to the necking. The term "horizontal maximum length" as used herein means the maximum magnitude of length in the horizontal direction which is found by obtaining the maximum value of the distance between any two points in any horizontal cross-section of the part of the seed crystal being immersed in the melt of silicon at the time of the immersion with every horizontal cross-section and finding the largest one in the group of the obtained maximum values each of which corresponds one by one to each horizontal cross-section.

In the method of this principle, the occurrence of dislocation in the seed crystal during the immersion of this seed crystal in the melt relies heavily on the thermal shock (thermal stress) due to a sudden change of temperature and on the surface condition of the crystal. The present inventors have discovered that the thermal shock can be quantitatively expressed by the temperature gradient which arises inside the crystal and the surface condition of crystal can be quantitatively expressed by the well-known Rmax value of surface roughness.

The inventors have also discovered that so long as the temperature gradient which arises in the crystal is not more than 10° C./mm, no dislocation occurs irrespectively of the surface condition (i.e. without reference to the presence or absence of a crack or contamination on the surface).

The present inventors, after carrying out an experiment by the use of a plurality of pulling furnace interior structures having various temperature distributions, have discovered that the occurrence of dislocation can be invariably curbed so long as the rate of immersion of the seed crystal in the melt is not more than 2.8 mm/min. Though this immersing rate may be at any level not more than 2.8 mm/min, it is preferred to be in the range of 0.01–2.8 mm/min where the actual efficiency of producing the silicon single crystal is taken into account.

Further, the present inventors have discovered that the temperature gradient which occurs during the immersion of the seed crystal in the melt is effectively diminished when the leading end of the seed crystal is convexed downward as illustrated in FIGS. 2–7, and particularly when the angle of leading end/10 mm of the seed crystal which will be defined clearly later is an acute angle as illustrated in FIGS. 3–7. The reason for this effectiveness is that the leading end of the seed crystal succumbs with difficulty to impartations of a temperature gradient because of a decreased thermal capacity thereof, suffers only small transfer of heat because of a small area of contact with the melt, and then allows the elevation of temperature in the seed crystal to proceed uniformly and slowly. The term "angle of leading end/10 mm" as used herein means the maximum value of the angle formed by the utmost leading end part of the seed crystal in the direction of crystal central axis and any two points on the surface of the seed crystal existing 10 mm above the utmost leading end part along the crystal central axis and, particularly when the utmost leading end part is not a point but a surface, means the Angle which is obtained by taking the maximum value of the angle formed by any point on the surface of the utmost leading end part and any two points on the surface of the seed crystal existing 10 mm above the utmost leading end part along the crystal central axis and by averaging this maximum value with relation to all points on the surface of the utmost leading end part. Incidentally, FIGS. 2–7 illustrate mere examples of the shape in which the leading end of the seed crystal is convexed downward and the present invention is not limited to these shapes. Particularly as a shape of the seed crystal other than that of the leading end thereof, any shape that is generally used in the production of a silicon single crystal such as a cylindrical shape or prismatic shape (polygon) may be adopted.

The present inventors have further discovered that when the leading end of the seed crystal has a symmetrical shape relative to the crystal central axis, most preferably a conical shape, the seed crystal is more effective in precluding the otherwise possible occurrence of ununiform temperature gradient in the crystal.

The occurrence of dislocation heavily hinges on the surface condition of the crystal. The dislocation inevitably occurs even under small thermal stress when the surface of the crystal has a disturbance in the atom configuration or the like. Incidentally, the present inventors have discovered that so long as the Rmax value of surface roughness for the reference length of 0.1 mm is not more than 5 $\mu$m, the occurrence of dislocation can be curbed irrespectively of the temperature gradient in the seed crystal, the immersing rate of the seed crystal in the melt, or the shape of the leading end of the seed crystal. The Rmax value indicates the distance between the top of the highest peak and the bottom of the deepest valley in the cross-sectional curve in the plane taken at the reference length.

They have discovered that when the seed crystal is manufactured by fabricating a dislocation-free silicon single crystal, the diminution of the surface roughness of the part of the seed crystal to be immersed in the melt is effectively accomplished by etching the seed crystal after it has been fabricated to a prescribed shape. The means for effecting the fabrication of the seed crystal does not need to be particularly limited. The standard machining such as, for example, cutting work, grinding work, or laser beam machining may be adopted.

Further, they have discovered that the surface of the part of the seed crystal to be immersed in the melt is preferred to be part of the original surface of the silicon single crystal as grown. Particularly, the crystal grown by the MCZ method (magnetic field applied Czochralski crystal growth method) possesses a further small surface roughness and constitutes itself the optimum surface for the part destined to be immersed in the melt.

The present inventors have further discovered that for the purpose of curbing the occurrence of dislocation, the use of a seed crystal doped to a high degree of not less than $1 \times 10^{17}$ cm$^{-3}$ is effective irrespectively of the choice between the p-type and the n-type. Since a dopant (doping material) is effective in fixing dislocation, the occurrence of dislocation can be curbed in a crystal which contains a dopant in a large amount. The upper limit to the dopant concentration is in the proximity of $1 \times 10^{20}$ cm$^{-3}$ in consideration of the dopant concentration normally used in the silicon single crystal.

The present invention is only required to fulfill at least any one of the conditions in a specific group of the found conditions mentioned above to attain growth of a dislocation-free silicon single crystal without recourse to the Dash's neck.

This invention allows a combination of two or more of these conditions to be simultaneously carried through. The manufacture of dislocation-free silicon single crystals is accomplished with a particularly satisfactory yield, for example, when the immersing rate of the seed crystal in the melt is not more than 2.8 mm/min and the part of the seed crystal destined to be immersed in the melt is the original surface of seed crystal as grown and when the angle of leading end/10 mm of the seed crystal is an acute angle and the part of the seed crystal destined to be immersed in the melt is the original surface of seed crystal as grown. Then, the manufacture of dislocation-free silicon single crystals is attained with still better yield when the immersing rate of the seed crystal in the melt is not more than 2.8 mm/min, the part of the seed crystal destined to be immersed in the melt is the original surface of seed crystal as grown, and the angle of leading end/10 mm of the seed crystal is an acute angle. Naturally, this invention permits the various conditions enumerated above to be executed in a variable combination other than those described herein.

The method of this invention for the production of a dislocation-free silicon single crystal as described above allows the diameter of the neck part to be not less than 5 mm. Thus, it allows the neck part to expand to a size necessary and enough for the growth of the main body part of a large diameter and a large weight. The size of the neck part, when necessary, may be increased to the fullest possible extent until it equals the size of the silicon single crystal to be grown.

The apparatus to be used in the present invention for the production of a dislocation-free silicon single crystal imposes no restriction particularly but requires only to be usable for the manufacture of a dislocation-free silicon single crystal by the standard CZ method. It may be such a manufacturing apparatus as illustrated in FIG. 1, for example.

This apparatus of FIG. 1 for the production of a silicon single crystal by the CZ method comprises a crucible 6 composed of a quartz crucible 6a for accommodating a melt M of silicon and a graphite crucible 6b for protecting the quartz crucible 6a and a crystal pulling furnace 1 for accommodating a grown dislocation-free silicon single crystal ingot S. Along the lateral side part of the crucible 6, a heater 4 and a heat insulating member 3 for preventing the heat emitted by the heater 4 from escaping to the exterior of the crystal pulling furnace 1 are disposed so as to enclose the crucible 6. This crucible 6 is connected through the medium of a rotary jig 5 to a drive device not shown in the diagram and is rotated at a prescribed speed by this drive device. The crucible 6 is raised or lowered by the drive device to compensate for the fall of the level of the melt M of silicon due to the decrease of the melt M of silicon held in the crucible 6. In the pulling furnace 1, a suspended pulling wire 7 is disposed. This wire 7 is fitted at the lower end thereof with a chuck 9 for retaining a seed crystal 8. This pulling wire 7 has the upper end side thereof taken up on a wire hoisting device 2 and by this operation the dislocation-free silicon single crystal ingot S is pulled up. The pulling furnace 1 introduces into the interior thereof Ar gas through a gas inlet 10 formed in the pulling furnace 1, passes the Ar gas through the interior of the pulling furnace 1, and releases it through a gas outlet 11. The passage of the Ar gas effected in this manner is intended for preventing the SiO generated inside the pulling furnace 1 in consequence of the fusion of silicon from mingling into the melt M of silicon.

EXAMPLE

Now, working examples of this invention will be described below.

In the following working examples and comparative examples, the judgment whether dislocation was present or absent in a given grown crystal was effected by polishing the grown crystal until a mirror surface and photographing an X-ray topographic profile of the ground face.

Example 1

In the apparatus of FIG. 1, a seed crystal was immersed in the melt under the following conditions.

Presence or absence of dislocation in seed crystal: absent

Maximum value of temperature gradient occurring in seed crystal: 9° C./mm

Immersing rate into melt: 4.0 mm/min

Shape of leading end of seed crystal: flat

Rmax value of part of seed crystal (reference length 0.1 mm) immersed in melt: 30 μm Surface condition of part of seed crystal immersed in melt: as ground Dopant concentration in seed crystal: boron=$1 \times 10^{15}$ cm$^{-3}$ Horizontal maximum length of part of seed crystal being immersed in melt at time of completion of immersion: 10 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 2 Ω.cm, oxygen concentration: 6.0–8.5×$10^{17}$ atoms/cm$^3$ (computed with the coefficient for conversion of oxygen concentration specified by Japan Electronics Industry Development Association), and carbon concentration: <$1.0 \times 10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm as described above, the silicon single crystal free of dislocation could be grown without resort to the Dash's neck.

Example 2

In the apparatus of FIG. 1, a seed crystal was immersed in the melt under the following conditions.

Presence or absence of dislocation in seed crystal: absent

Maximum value of the temperature gradient occurring in seed crystal: 8° C./mm

Immersing rate into melt: 2.6 mm/min

Shape of leading end of seed crystal: flat

Rmax values of part of seed crystal (reference length 0.1 mm) immersed in melt: 28 μm Surface condition of part of seed crystal immersed in melt: as ground Dopant concentration in seed crystal: phosphorus=$2 \times 10^{15}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 10 Ω.cm, oxygen concentration: 7.0–7.5×$10^{17}$ atoms/cm$^3$ (computed with the coefficient for conversion of oxygen concentration specified by Japan Electronics Industry Development Association), and carbon concentration: <$1.0 \times 10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm and the immersion rate of seed crystal in the melt was not more than 2.8 mm/min as described above, the silicon single crystal free of dislocation could be grown without resort to the Dash's neck.

Example 3

In the apparatus of FIG. 1, a seed crystal was immersed in the melt under the following conditions.

Presence or absence of dislocation in seed crystal: absent

Maximum value of temperature gradient occurring in seed crystal: 7° C./mm

Immersing rate into melt: 3.6 mm/min

Figure 2A:
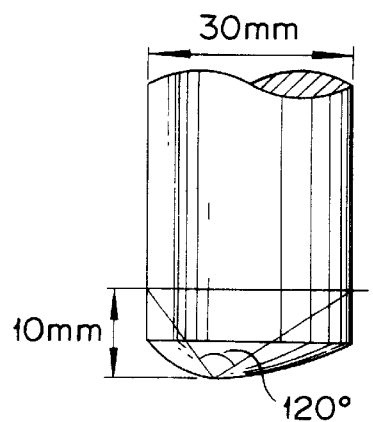
FIGS. 2A and 2B are, respectively, front and perspective views illustrating the shape of the leading end of a seed crystal used in Examples 3 and 21.
Figure 2B:
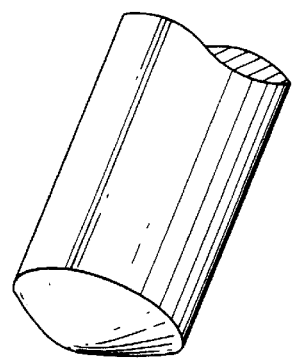

Shape of leading end of seed crystal: convexed downward (as illustrated in FIGS. 2A and 2B)

Angle of leading end/10 mm of seed crystal: 120 degrees

Rmax value of part of seed crystal (reference length 0.1 mm) immersed in melt: 42 μm Surface condition of part of seed crystal immersed in melt: as ground Dopant concentration in seed crystal: phosphorus=$2 \times 10^{14}$ cm$^{-3}$ Horizontal maximum length of part of seed crystal being immersed in melt at time of completion of immersion: 30 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 5 Ω.cm, oxygen concentration: 7.8–8.5×

$10^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm and the leading end of the seed crystal was convexed downward as described above, the silicon single crystal free of dislocation could be grown without resort to the Dash's neck.

Example 4

In the apparatus of FIG. 1, a seed crystal was immersed in the melt under the following conditions.

Presence or absence of dislocation in seed crystal: absent

Maximum value of temperature gradient occurring in seed crystal: 6° C./mm

Immersing rate into melt: 4.0 mm/min

Figure 3A:
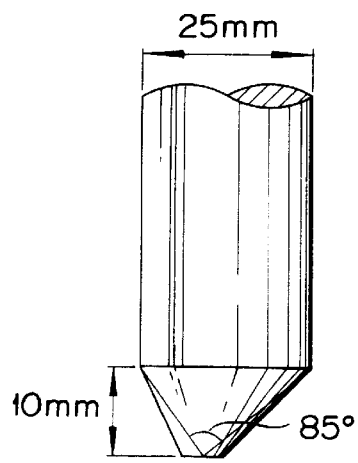
FIGS. 3A and 3B are, respectively, front and perspective views illustrating the shape of the leading end of a seed crystal used in Examples 4 and 22.
Figure 3B:
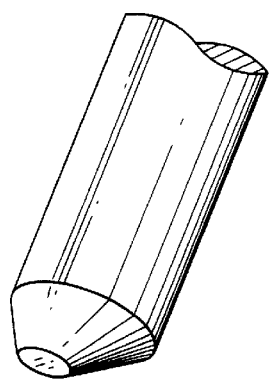

Shape of leading end of seed crystal: convexed downward (as illustrated in FIGS. 3A and 3B)

Angle of leading end/10 mm of seed crystal: 85 degrees

The shape of the leading end of the seed crystal was not symmetrical relative to the crystal central axis Rmax value of part of seed crystal (reference length 0.1 mm) immersed in melt: 42 μm Surface condition of part of seed crystal immersed in melt: as ground Dopant concentration in seed crystal: boron=3×10$^{15}$ cm$^{-3}$ Horizontal maximum length of part of seed crystal being immersed in melt at time of completion of immersion: 25 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 8.5–9.0×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm and the angle of leading end/10 mm of the seed crystal was an acute angle as described above, the silicon single crystal free of dislocation could be grown without resort to the Dash's neck.

Example 5

In the apparatus of FIG. 1, a seed crystal was immersed in the melt under the following conditions.

Presence or absence of dislocation in seed crystal: absent

Maximum value of temperature gradient occurring in seed crystal: 5° C./mm

Immersing rate into melt: 4.0 mm/min

Figure 4A:
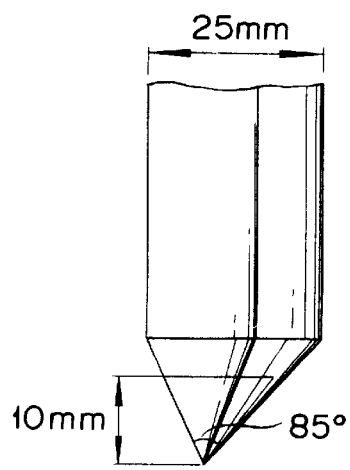
FIGS. 4A and 4B are, respectively, front and perspective views illustrating the shape of the leading end of a seed crystal used in Examples 5 and 23.
Figure 4B:
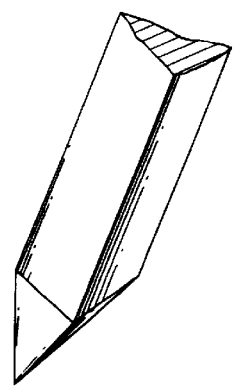

Shape of leading end of seed crystal: convexed downward (as illustrated in FIGS. 4A and 4B)

Angle of leading end/10 mm of seed crystal: 80 degrees

The shape of the leading end of the seed crystal was symmetrical relative to the crystal central axis (triangular cone)

Rmax value of part of seed crystal (reference length 0.1 mm) immersed in melt: 42 μm Surface condition of part of seed crystal immersed in melt: as ground Dopant concentration in seed crystal: boron=8×10$^{14}$ cm$^{-3}$ Horizontal maximum length of part of seed crystal being immersed in melt at time of completion of immersion: 25 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 8.0–8.7×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm, the angle of leading end/10 mm of the seed crystal was an acute angle, and the leading end of the seed crystal was symmetrical relative to the crystal central axis as described above, the silicon single crystal free of dislocation could be grown without resort to the Dash's neck.

Example 6

In the apparatus of FIG. 1, a seed crystal was immersed in the melt under the following conditions.

Presence or absence of dislocation in seed crystal: absent

Maximum value of temperature gradient occurring in seed crystal: 6° C./mm

Immersing rate into melt: 5.0 mm/min

Shape of leading end of seed crystal: convexed downward

Angle of leading end/10 mm of seed crystal: 82 degrees

The shape of the leading end of the seed crystal was symmetrical relative to the crystal central axis (conical shape)

Rmax value of part of seed crystal (reference length 0.1 mm) immersed in melt: 35 μm Surface condition of part of seed crystal immersed in melt: as ground Dopant concentration in seed crystal: boron=4×10$^{15}$ cm$^{-3}$ Horizontal maximum length of part of seed crystal being immersed in melt at time of completion of immersion: 25 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 8.2–8.9×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm, the angle of leading end/10 mm of the seed crystal was an acute angle, and the leading end of the seed crystal was in a conical shape as described above, the silicon single crystal free of dislocation could be grown without resort to the Dash's neck.

Example 7

In the apparatus of FIG. 1, a seed crystal was immersed in the melt under the following conditions.

Presence or absence of dislocation in seed crystal: absent

Maximum value of temperature gradient occurring in seed crystal: 3° C./mm

Immersing rate into melt: 1.8 mm/min

Figure 5A:
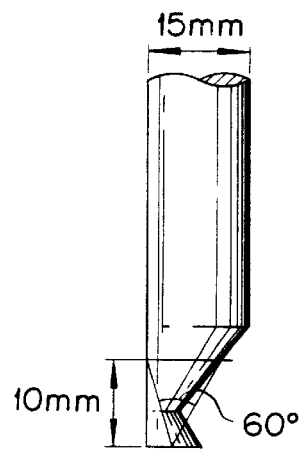
FIGS. 5A and 5B are, respectively, front and perspective views illustrating the shape of the leading end of a seed crystal used in Examples 7 and 25.
Figure 5B:
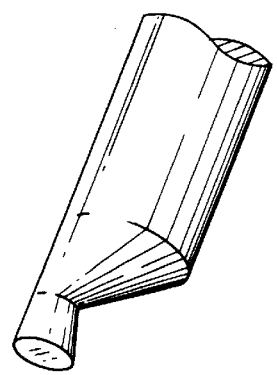

Shape of leading end of seed crystal: convexed downward (as shown in FIGS. 5A and 5B)

Angle of leading end/10 mm of seed crystal: 60 degrees

The shape of the leading end of the seed crystal was asymmetrical relative to the crystal central axis Rmax value of part of seed crystal (reference length 0.1 mm) immersed in melt: 35.0 μm Surface condition of part of seed crystal immersed in melt: as ground Dopant concentration in seed crystal: boron=2×10$^{15}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 7.5–8.0×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the maximum value of the temperature gradient occurring in the seed crystal was not more than 10° C./mm, the rate of immersion of the seed crystal in the melt was not more than 2.8 mm/min, and the angle of leading end/10 mm of the seed crystal was an acute angle as described above, the silicon single crystal free of dislocation could be grown without resort to the Dash's neck.

Example 8

In the apparatus of FIG. 1, a seed crystal was immersed in the melt under the following conditions.

Presence or absence of dislocation in seed crystal: absent

Maximum value of temperature gradient occurring in seed crystal: 15° C./mm

Immersing rate into melt: 10.0 mm/min

Shape of leading end of seed crystal: flat

Rmax value of part of seed crystal (reference length 0.1 mm) immersed in melt: 4.5 μm Surface condition of part of seed crystal immersed in melt: as worked by laser beam Dopant concentration in seed crystal: phosphorus=8×10$^{14}$ cm$^{-3}$ Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 5 Ω.cm, oxygen concentration: 7.2–7.9×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the Rmax value of the part of the seed crystal (reference length 0.1 mm) immersed in the melt was not more than 5 μm as described above, the silicon single crystal free of dislocation could be grown without resort to the Dash's neck.

Example 9

In the apparatus of FIG. 1, a seed crystal was immersed in the melt under the following conditions.

Presence or absence of dislocation in seed crystal: absent

Maximum value of temperature gradient occurring in seed crystal: 15° C./mm

Immersing rate into melt: 10.0 mm/min

Shape of leading end of seed crystal: flat

Rmax value of part of seed crystal (reference length 0.1 mm) immersed in melt: 4.0 μm Surface condition of part of seed crystal immersed in melt: ground and etched Dopant concentration in seed crystal: boron=8×10$^{14}$ cm$^{-3}$ Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 7.2–7.9×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the Rmax value of the part of the seed crystal (reference length 0.1 mm) to be immersed in the melt was not more than 5 μm and the part of the seed crystal to be immersed was machined and etched as described above, the silicon single crystal free of dislocation could be grown without resort to the Dash's neck.

Example 10

In the apparatus of FIG. 1, a seed crystal was immersed in the melt under the following conditions.

Presence or absence of dislocation in seed crystal: absent

Maximum value of temperature gradient occurring in seed crystal: 18° C./mm

Immersing rate into melt: 5.0 mm/min

Shape of leading end of seed crystal: convexed downward

Angle of leading end/10 mm of seed crystal: 110 degrees

Rmax value of part of seed crystal (reference length 0.1 mm) immersed in melt: 1.0 μm Surface condition of part of seed crystal immersed in melt: mini-ingot (as grown by the non-MCZ standard CZ method)

Dopant concentration in seed crystal: boron=5×$10^{15}$ cm$^{-3}$

Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 8.0–8.5×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the Rmax value of the part of the seed crystal (reference length 0.1 mm) to be immersed in the melt was not more than 5 μm, the leading end of the seed crystal was convexed downward, and the part of the seed crystal to be immersed was as grown as described above, the silicon single crystal free of dislocation could be grown without resort to the Dash's neck.

Example 11

In the apparatus of FIG. 1, a seed crystal was immersed in the melt under the following conditions.

Presence or absence of dislocation in seed crystal: absent

Maximum value of temperature gradient occurring in seed crystal: 18° C./mm

Immersing rate into melt: 5.0 mm/min

Shape of leading end of seed crystal: convexed downward

Angle of leading end/10 mm of seed crystal: 120 degrees

Rmax value of part of seed crystal (reference length 0.1 mm) immersed in melt: 1.0 μm Surface condition of part of seed crystal immersed in melt: mini-ingot (as grown by the MCZ method)

Dopant concentration in seed crystal: boron=5×$10^{15}$ cm$^{-3}$

Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 8.0–8.5×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the Rmax value of the part of the seed crystal (reference length 0.1 mm) to be immersed in the melt was not more than 5 μm, the leading end of the seed crystal was convexed downward, and the part of the seed crystal to be immersed in the melt was as grown by the MCZ method as described above, the silicon single crystal free of dislocation could be grown without resort to the Dash's neck.

Example 12

In the apparatus of FIG. 1, a seed crystal was immersed in the melt under the following conditions.

Presence or absence of dislocation in seed crystal: absent

Maximum value of temperature gradient occurring in seed crystal: 12° C./mm

Immersing rate into melt: 8.0 mm/min

Shape of leading end of seed crystal: flat

Rmax value of part of seed crystal (reference length 0.1 mm) immersed in melt: 35.0 μm Surface condition of part of seed crystal immersed in melt: as ground Dopant concentration in seed crystal: boron=2×$10^{17}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 8.0–8.5×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the dopant concentration in the seed crystal was not less than 1×$10^{17}$ cm$^{-3}$ as described above, the silicon single crystal free of dislocation could be grown without resort to the Dash's neck.

Example 13

In the apparatus of FIG. 1, a seed crystal was immersed in the melt under the following conditions.

Presence or absence of dislocation in seed crystal: absent

Maximum value of temperature gradient occurring in seed crystal: 12° C./mm

Immersing rate into melt: 8.0 mm/min

Shape of leading end of seed crystal: flat

Rmax value of part of seed crystal (reference length 0.1 mm) immersed in melt: 35.0 μm Surface condition of part of seed crystal immersed in melt: as ground Dopant concentration in seed crystal: phosphorus=2×$10^{17}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 5 Ω.cm, oxygen concentration: 8.0–8.5×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the dopant concentration in the seed crystal was not less than 1×$10^{17}$ cm$^{-3}$ as described above, the silicon single crystal free of dislocation could be grown without resort to the Dash's neck.

Example 14

In the apparatus of FIG. 1, a seed crystal was immersed in the melt under the following conditions.

Presence or absence of dislocation in seed crystal: absent

Maximum value of temperature gradient occurring in seed crystal: 4° C./mm

Immersing rate into melt: 1.0 mm/min

Shape of leading end of seed crystal: flat

Rmax value of part of seed crystal (reference length 0.1 mm) immersed in melt: 3.0 μm Surface condition of part of seed crystal immersed in melt: ground and etched Dopant concentration in seed crystal: phosphorus=4×$10^{15}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 7 Ω.cm, oxygen concentration: 6.5–7.5×$10^{17}$ atoms/cm$^3$ (computed with the coefficient for conversion of oxygen concentration specified by Japan Electronics Industry Development Association), and carbon concentration: <1.0×$10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the immersing rate of the seed crystal in the melt was not more than 2.8 mm/min, the Rmax value of the part of the seed crystal (reference length 0.1 mm) to be immersed in the melt was not more than 5 μm, and the part of the seed crystal to be immersed in the melt was machined and etched as described above, the silicon single crystal free of dislocation could be grown without resort to the Dash's neck.

Example 15

In the apparatus of FIG. 1, a seed crystal was immersed in the melt under the following conditions.

Presence or absence of dislocation in seed crystal: absent

Maximum value of temperature gradient occurring in seed crystal: 8° C./mm

Immersing rate into melt: 7.0 mm/min

Figure 6A:
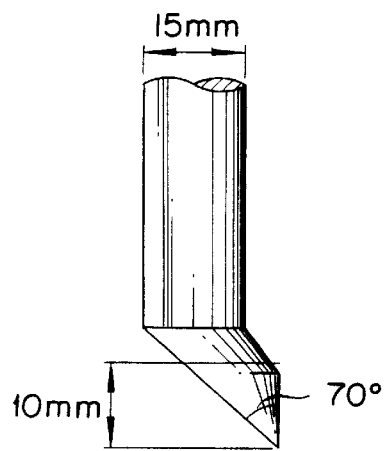
FIGS. 6A and 6B are, respectively, front and perspective views illustrating the shape of the leading end of a seed crystal used in Examples 15 and 30.
Figure 6B:
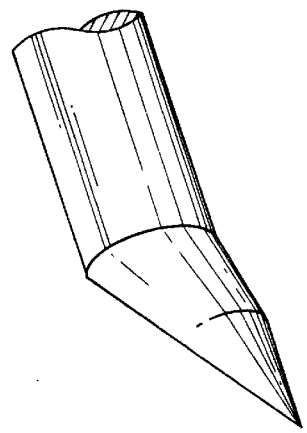

Shape of leading end of seed crystal: convexed downward (as illustrated in FIGS. 6A and 6B)

Angle of leading end/10 mm of seed crystal: 70 degrees

The shape of the leading end of the seed crystal was asymmetrical relative to the crystal central axis Rmax value of part of seed crystal (reference length 0.1 mm) immersed in melt: 4.0 μm Surface condition of part of seed crystal immersed in melt: ground and etched Dopant concentration in seed crystal: phosphorus=$2\times10^{14}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 10 Ω.cm, oxygen concentration: 7.5–8.0×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the Rmax value of the part of the seed crystal (reference length 0.1 mm) to be immersed in the melt was not more than 5 μm, the angle of leading end/10 mm of the seed crystal was an acute angle, and the part of the seed crystal to be immersed in the melt was machined and etched as described above, the silicon single crystal free of dislocation could be grown without resort to the Dash's neck.

Example 16

In the apparatus of FIG. 1, a seed crystal was immersed in the melt under the following conditions.

Presence or absence of dislocation in seed crystal: absent

Maximum value of temperature gradient occurring in seed crystal: 3° C./mm

Immersing rate into melt: 1.2 mm/min

Figure 7A:
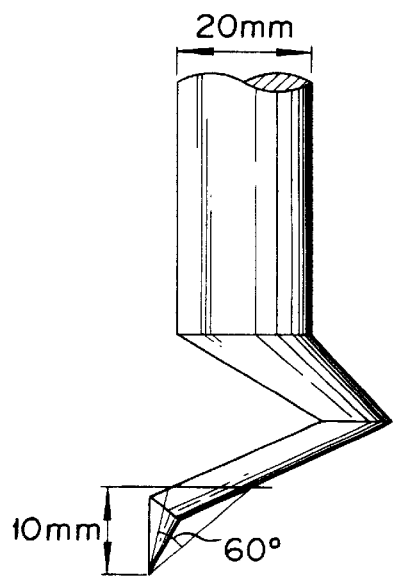
FIGS. 7A and 7B are, respectively, front and perspective views illustrating the shape of the leading end of a seed crystal used in Examples 16 and 31.
Figure 7B:
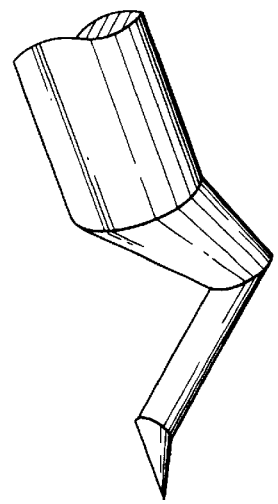

Shape of leading end of seed crystal: convexed downward (as illustrated in FIGS. 7A and 7B)

Angle of leading end, 10 mm of seed crystal: 60 degrees

The shape of the leading end of the seed crystal was asymmetrical relative to the crystal central axis Rmax value of part of seed crystal (reference length 0.1 mm) immersed in melt: 2.0 μm Surface condition of part of seed crystal immersed in melt: ground and etched Dopant concentration in seed crystal: boron=1×10$^{15}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 7.5–8.5×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the immersing rate of the seed crystal into the melt was not more than 2.8 mm/min, the Rmax value of the part of the seed crystal (reference length 0.1 mm) to be immersed in the melt was not more than 5 μm, the angle of leading end/10 mm of the seed crystal was an acute angle, and the part of the seed crystal to be immersed in the melt was machined and etched as described above, the silicon single crystal free of dislocation could be grown without resort to the Dash's neck.

Example 17

In the apparatus of FIG. 1, a seed crystal was immersed in the melt under the following conditions.

Presence or absence of dislocation in seed crystal: absent

Maximum value of temperature gradient occurring in seed crystal: 2° C./mm

Immersing rate into melt: 1.2 mm/min

Shape of leading end of seed crystal: convexed downward

Angle of leading end/10 mm of seed crystal: 110 degrees

Rmax value of part of seed crystal (reference length 0.1 mm) immersed in melt: 2.0 μm Surface condition of part of seed crystal immersed in melt: mini-ingot (as grown by the non-MCZ standard CZ method)

Dopant concentration in seed crystal: phosphorus 1×10$^{15}$ cm$^{-3}$

Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 8 Ω.cm, oxygen concentration: 8.5–9.5×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the immersing rate of the seed crystal into the melt was not more than 2.8 mm/min, the Rmax value of the part of the seed crystal (reference length 0.1 mm) to be immersed in the melt was not more than 5 μm, the leading end of the seed crystal was convexed downward, and the part of the seed crystal to be immersed in the melt was as grown as described above, the silicon single crystal free of dislocation could be grown without resort to the Dash's neck.

Example 18

In the apparatus of FIG. 1, a seed crystal was immersed in the melt under the following conditions.

Presence or absence of dislocation in seed crystal: absent

Maximum value of temperature gradient occurring in seed crystal: 1.8° C./mm

Immersing rate into melt: 5.0 mm/min

Shape of leading end of seed crystal: convexed downward

Angle of leading end/10 mm of seed crystal: 60 degrees

The shape of the leading end of the seed crystal was symmetrical relative to the crystal central axis (conical shape)

Rmax value of part of seed crystal (reference length 0.1 mm) immersed in melt: 1.5 μm Surface condition of part of seed crystal immersed in melt: mini-ingot (as grown by the non-MCZ standard CZ method)

Dopant concentration in seed crystal: boron=$2 \times 10^{15}$ c$^{-3}$

Horizontal maximum length of part of seed crystal being immersed in melt at time of completion of immersion: 18 mm A tail part was formed in the mini-ingot of the seed crystal and the tail part was immersed. After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 2 Ω.cm, oxygen concentration: 7.0–7.5× $10^{17}$ atoms/cm$^3$ (computed with the coefficient for conversion of oxygen concentration specified by Japan Electronics Industry Development Association), and carbon concentration: <$1.0 \times 10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the Rmax value of the part of the seed crystal (reference length 0.1 mm) to be immersed in the melt was not more than 5 μm, the angle of leading end/10 mm, of the seed crystal was an acute angle, and the part of the seed crystal to be immersed in the melt was as grown as described above, the silicon single crystal free of dislocation could be grown without resort to the Dash's neck.

Example 19

In the apparatus of FIG. 1, a seed crystal was immersed in the melt under the following conditions.

Presence or absence of dislocation in seed crystal: Absent

Maximum value of temperature gradient occurring in seed crystal: 1.5° C./mm

Immersing rate into melt: 1.0 mm/min

Shape of leading end of seed crystal: convexed downward

Angle of leading end/10 mm of seed crystal: 45 degrees

Rmax value of part of seed crystal (reference length 0.1 mm) immersed in melt: 1.3 μm Surface condition of part of seed crystal immersed in melt: mini-ingot (as grown by the non-MCZ standard CZ method)

Dopant concentration in seed crystal: boron=$3 \times 10^{15}$ cm$^{-3}$

Horizontal maximum length of part of seed crystal being immersed in melt at time of completion of immersion: 22 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 4 Ω.cm, oxygen concentration: 8.3–9.0× $10^{17}$ atoms/cm$^3$ (computed with the coefficient for conversion of oxygen concentration specified by Japan Electronics Industry Development Association), and carbon concentration: <$1.0 \times 10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the maximum value of the temperature gradient occurring in the seed crystal was not more than 10° C./mm, the immersing rate of the seed crystal into the melt was not more than 2.8 mm/min, the Rmax value of the part of the seed crystal (reference length 0.1 mm) to be immersed in the melt was not more than 5 μm, the angle of leading end/10 mm of the seed crystal was an acute angle, and the part of the seed crystal to be immersed in the melt was as grown as described above, the silicon single crystal free of dislocation could be grown without resort to the Dash's neck.

Example 20

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 2.6 mm/min

Shape of leading end of seed crystal: flat

Rmax value of part of seed crystal (reference length 0.1 mm) immersed in melt: 28 μm Surface condition of part of seed crystal immersed in melt: as ground Dopant concentration in seed crystal: phosphorus=$5 \times 10^{15}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 8 Ω.cm, oxygen concentration: 7.0–7.5× $10^{17}$ atoms/cm$^3$ (computed with the coefficient for conversion of oxygen concentration specified by Japan Electronics Industry Development Association), and carbon concentration: <$1.0 \times 10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the immersing rate of the seed crystal into the melt was not more than 2.8 mm/min as described above, the silicon single crystal free of dislocation could be grown without resort to the Dash's neck.

Example 21

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 3.6 mm/min

Shape of leading end of seed crystal: convexed downward (as illustrated in FIGS. 2A and 2B)

Angle of leading end/10 mm of seed crystal: 120 degrees

Rmax value of part of seed crystal (reference length 0.1 mm) immersed in melt: 42 $\mu$m Surface condition of part of seed crystal immersed in melt: as ground Dopant concentration in seed crystal: phosphorus=1×10$^{14}$ cm$^{-3}$ Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 5 $\Omega$.cm, oxygen concentration: 7.8–8.5×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the leading end of the seed crystal was convexed downward as described above, the silicon single crystal free of dislocation could be grown without resort to the Dash's neck.

Example 22

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 4.0 mm/min

Shape of leading end of seed crystal: convexed downward (as illustrated in FIGS. 3A and 3B)

Angle of leading end/10 mm of seed crystal: 85 degrees

The shape of the leading end of the seed crystal was not symmetrical relative to the crystal central axis Rmax value of part of seed crystal (reference length 0.1 mm) immersed in melt: 35 $\mu$m Surface condition of part of seed crystal immersed in melt: as ground Dopant concentration in seed crystal: boron=3×10$^{15}$ cm$^{-3}$ Horizontal maximum length of part of seed crystal being immersed in melt at time of completion of immersion: 25 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 $\Omega$.cm, oxygen concentration: 8.5–8.8×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the angle of leading end/10 mm of the seed crystal was an acute angle as described above, the silicon single crystal free of dislocation could be grown without resort to the Dash's neck.

Example 23

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 4.0 mm/min

Shape of leading end of seed crystal: convexed downward (as illustrated in FIGS. 4A and 4B)

Angle of leading end/10 mm of seed crystal: 80 degrees

The shape of the leading end of the seed crystal was symmetrical relative to the crystal central axis (triangular cone)

Rmax value of part of seed crystal (reference length 0.1 mm) immersed in melt: 42 $\mu$m Surface condition of part of seed crystal immersed in melt: as ground Dopant concentration in seed crystal: boron=1×10$^{14}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 $\Omega$.cm, oxygen concentration: 8.3–8.7×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the angle of leading end/10 mm of the seed crystal was an acute angle and the leading end of the seed crystal was symmetrical relative to the crystal central axis as described above, the silicon single crystal free of dislocation could be grown without resort to the Dash's neck.

Example 24

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 5.0 mm/min

Shape of leading end of seed crystal: convexed downward

Angle of leading end/10 mm of seed crystal: 82 degrees

The shape of the leading end of the seed crystal was symmetrical relative to the crystal central axis (conical Rmax value of part of seed crystal (reference length 0.1 mm) immersed in melt: 35 $\mu$m Surface condition of part of seed crystal immersed in melt: as ground Dopant concentration in seed crystal: boron=1×10$^{15}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 8.2–8.9×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the angle of leading end/10 mm of the seed crystal was an acute angle and the leading end of the seed crystal was in a conical shape as described above, the silicon single crystal free of dislocation could be grown without resort to the Dash's neck.

Example 25

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 1.8 mm/min

Shape of leading end of seed crystal: convexed downward (as illustrated in FIGS. 5A and 5B)

Angle of leading end/10 mm of seed crystal: 60 degrees

The shape of the leading end of the seed crystal was asymmetrical relative to the crystal central axis Rmax value of part of seed crystal (reference length 0.1 mm) immersed in melt: 35.0 $\mu$m Surface condition of part of seed crystal immersed in melt: as ground Dopant concentration in seed crystal: boron=1×10$^{15}$ Horizontal maximum length of part of seed crystal being immersed in melt at time of completion of immersion: 12 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 7.0–8.0×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and the part of the seed crystal to be immersed in the melt had been machined and when the immersing rate of the seed crystal in the melt was not more than 2.8 mm/min and the angle of leading end/10 mm of the seed crystal was an acute angle as described above, the silicon single crystal free of dislocation could be grown without resort to the Dash's neck.

Example 26

In the apparatus of FIG. 1, a seed crystal was immersed in the melt under the following conditions.

Presence or absence of dislocation in seed crystal: absent

Maximum value of temperature gradient occurring in seed crystal: 15° C./mm

Immersing rate into melt: 10.0 mm/min

Shape of leading end of seed crystal: flat

Rmax value of part of seed crystal (reference length 0.1 mm) immersed in melt: 5.2 $\mu$m Surface condition of part of seed crystal immersed in melt: ground and etched Dopant concentration in seed crystal: boron=8×10$^{14}$ cm$^{-3}$ Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 7.2–7.9×10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the part of the seed crystal to be immersed in the melt was machined and etched as described above, the silicon single crystal free of dislocation could be grown without resort to the Dash's neck.

Example 27

In the apparatus of FIG. 1, a seed crystal was immersed in the melt under the following conditions.

Presence or absence of dislocation in seed crystal: absent

Maximum value of temperature gradient occurring in seed crystal: 18° C./mm

Immersing rate into melt: 5.0 mm/min

Shape of leading end of seed crystal: convexed downward

Angle of leading end/10 mm of seed crystal: 110 degrees

Rmax value of part of seed crystal (reference length 0.1 mm) immersed in melt: 6.0 µm Surface condition of part of seed crystal immersed in melt: mini-ingot (as grown by the non-MCZ standard CZ method)

Dopant concentration in seed crystal: boron=$1\times10^{15}$ cm$^{-3}$

Horizontal maximum length of part of seed crystal being immersed in melt at time of completion of immersion: 15 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 8.2–8.5× $10^{17}$ atoms/cm$^3$ (computed with the coefficient for conversion of oxygen concentration specified by Japan Electronics Industry Development Association), and carbon concentration: <$1.0\times10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the leading end of the seed crystal was convexed downward and the part of the seed crystal to be immersed in the melt was as grown as described above, the silicon single crystal free of dislocation could be grown without resort to the Dash's neck.

Example 28

In the apparatus of FIG. 1, a seed crystal was immersed in the melt under the following conditions.

Presence or absence of dislocation in seed crystal: absent

Maximum value of temperature gradient occurring in seed crystal: 18° C./mm

Immersing rate into melt: 5.0 mm/min

Shape of leading end of seed crystal: convexed downward

Angle of leading end/10 mm of seed crystal: 120 degrees

Rmax value of part of seed crystal (reference length 0.1 mm) immersed in melt: 6.0 µm Surface condition of part of seed crystal immersed in melt: mini-ingot (as grown by the MCZ method)

Dopant concentration in seed crystal: boron=$3\times10^{15}$ cm$^{-3}$

Horizontal maximum length of part of seed crystal being immersed in melt at time of completion of immersion: 10 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 5 Ω.cm, oxygen concentration: 8.0–8.3× $10^{17}$ atoms/cm$^3$ (computed with the coefficient for conversion of oxygen concentration specified by Japan Electronics Industry Development Association), and carbon concentration: <$1.0\times10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the leading end of the seed crystal was convexed downward and the part of the seed crystal to be immersed in the melt was as grown by the MCZ method as described above, the silicon single crystal free of dislocation could be grown without resort to the Dash's neck.

Example 29

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 1.0 mm/min

Shape of leading end of seed crystal: flat

Rmax value of part of seed crystal (reference length 0.1 mm) immersed in melt: 8.0 µm Surface condition of part of seed crystal immersed in melt: ground and etched Dopant concentration in seed crystal: phosphorus=$1\times10^{15}$ cm$^{-3}$ Horizontal maximum length of part of seed crystal being immersed in melt at time of completion of immersion: 10 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 7 Ω.cm, oxygen concentration: 7.0–7.5× $10^{17}$ atoms/cm$^3$ (computed with the coefficient for conversion of oxygen concentration specified by Japan Electronics Industry Development Association), and carbon concentration: <$1.0\times10^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the immersing rate of the seed crystal in the melt was not more than 2.8 mm/min and the part of the seed crystal to be immersed in the melt was machined and etched as described above, the silicon single crystal free of dislocation could be grown without resort to the Dash's neck.

Example 30

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 7.0 mm/min

Shape of leading end of seed crystal: convexed downward (as illustrated in FIGS. 6A and 6B)

Angle of leading end/10 mm of seed crystal: 70 degrees

The shape of the leading end of the seed crystal was asymmetrical relative to the crystal central axis Rmax value of part of seed crystal (reference length 0.1 mm) immersed in melt: 5.5 µm Surface condition of part of seed crystal immersed in melt: ground and etched Dopant concentration in seed crystal: phosphorus=$5\times10^{14}$ $cm^{-3}$ Horizontal maximum length of part of seed crystal being immersed in melt at time of completion of immersion: 12 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: n-type. Crystal diameter: 310 mm (12 inches), resistivity: 8 Ω.cm, oxygen concentration: 7.5–8.0×$10^{17}$ atoms/$cm^3$ (computed with the coefficient for conversion of oxygen concentration specified by Japan Electronics Industry Development Association), and carbon concentration: <$1.0\times10^{17}$ atoms/$cm^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the angle of leading end/10 mm of the seed crystal was an acute angle and the part of the seed crystal to be immersed in the melt was machined and etched as described above, the silicon single crystal free of dislocation could be grown without resort to the Dash's neck.

Example 31

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 1.2 mm/min

Shape of leading end of seed crystal: convexed downward (as illustrated in FIGS. 7A and 7B)

Angle of leading end/10 mm of seed crystal: 60 degrees

The shape of the leading end of the seed crystal was asymmetrical relative to the crystal central axis Rmax value of part of seed crystal (reference length 0.1 mm) immersed in melt: 6.0 µm Surface condition of part of seed crystal immersed in melt: ground and etched Dopant concentration in seed crystal: boron=$5\times10^{15}$ $cm^{-3}$ Horizontal maximum length of part of seed crystal being immersed in melt at time of completion of immersion: 18 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 10 Ω.cm, oxygen concentration: 7.5–8.5×$10^{17}$ atoms/$cm^3$ (computed with the coefficient for conversion of oxygen concentration specified by Japan Electronics Industry Development Association), and carbon concentration: <$1.0\times10^{17}$ atoms/$cm^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the immersing rate of the seed crystal in the melt was not more than 2.8 mm/min, the angle of leading end/10 mm of the seed crystal was an acute angle, and the part of the seed crystal to be immersed in the melt was machined and etched as described above, the silicon single crystal free of dislocation could be grown without resort to the Dash's neck.

Example 32

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 1.2 mm/min

Shape of leading end of seed crystal: flat

Rmax value of part of seed crystal (reference length 0.1 mm) immersed in melt: 6.0 µm Surface condition of part of seed crystal immersed in melt: mini-ingot (as grown by the non-MCZ standard CZ method)

Dopant concentration in seed crystal: boron=$1\times10^{15}$ $cm^{-3}$

Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 6 Ω.cm, oxygen concentration: 8.5–9.5×$10^{17}$ atoms/$cm^3$ (computed with the coefficient for conversion of oxygen concentration specified by Japan Electronics Industry Development Association), and carbon concentration: <$1.0\times10^{17}$ atoms/$cm^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the immersing rate of the seed crystal in the melt was not more than 2.8 mm/min and the part of the seed crystal to be immersed in the melt was as grown as described above, the silicon single crystal free of dislocation could be grown without resort to the Dash's neck.

Example 33

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 5.0 mm/min

Shape of leading end of seed crystal: convexed downward

Angle of leading end/10mm of seed crystal: 60 degrees

The shape of the leading end of the seed crystal was symmetrical relative to the crystal central axis (conical shape)

Rmax value of part of seed crystal (reference length 0.1 mm) immersed in melt: 6.0 $\mu$m Surface condition of part of seed crystal immersed in melt: mini-ingot (as grown by the non-MCZ standard CZ method)

Dopant concentration in seed crystal: boron=1×10$^{15}$ cm$^{-3}$

Horizontal maximum length of part of seed crystal being immersed in melt at time of completion of immersion: 18 mm A tail part was formed in the mini-ingot of the seed crystal and the tail part was immersed. After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 6 $\Omega$.cm, oxygen concentration: 7.0–7.5× 10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the angle of leading end/10 mm of the seed crystal was an acute angle and the part of the seed crystal to be immersed in the melt was as grown as described above, the silicon single crystal free of dislocation could be grown without resort to the Dash's neck.

Example 34

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 1.0 mm/min

Shape of leading end of seed crystal: convexed downward

Angle of leading end/10 mm of seed crystal: 45 degrees

Rmax value of part of seed crystal (reference length 0.1 mm) immersed in melt: 5.5 $\mu$m Surface condition of part of seed crystal immersed in melt: mini-ingot (as grown by the non-MCZ standard CZ method)

Dopant concentration in seed crystal: boron=3×10$^{15}$ cm$^{-3}$

Horizontal maximum length of part of seed crystal being immersed in melt at time of completion of immersion: 22 mm After the immersion of the seed crystal was completed and the crystal was fully wetted with the melt, the main body part of silicon single crystal was grown with no recourse to the Dash's neck.

The silicon single crystal grown under these conditions had the following quality.

Type of conduction: p-type. Crystal diameter: 310 mm (12 inches), resistivity: 4 $\Omega$.cm, oxygen concentration: 8.3–9.0× 10$^{17}$ atoms/cm$^3$ (computed with the coefficient for conversion of oxygen concentration specified by Japan Electronics Industry Development Association), and carbon concentration: <1.0×10$^{17}$ atoms/cm$^3$ (computed with the coefficient for conversion of carbon concentration specified by Japan Electronics Industry Development Association).

The grown silicon single crystal was free of dislocation.

When the horizontal maximum length of the part of the seed crystal being immersed in the melt at the time of completion of the immersion was not less than 5 mm and when the immersing rate of the seed crystal in the melt was not more than 2.8 mm/min, the angle of leading end/10 mm of the seed crystal was an acute angle, and the part of the seed crystal to be immersed in the melt was as grown as described above, the silicon single crystal free of dislocation could be grown without resort to the Dash's neck.

Comparative Example 1

In the apparatus of FIG. 1, a seed crystal was immersed in the melt under the following conditions.

Presence or absence of dislocation in seed crystal: absent

Maximum value of temperature gradient occurring in seed crystal: 11° C./mm

Immersing rate into melt: 3.0 mm/min

Shape of leading end of seed crystal: flat

Rmax value of part of seed crystal (reference length 0.1 mm) immersed in melt: 6.0 $\mu$m Surface condition of part of seed crystal immersed in melt: as ground Dopant concentration in seed crystal: boron=1×10$^{15}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal thus grown was in a dislocated state.

Even if the horizontal maximum length of the part of the seed crystal being immersed in the melt of silicon at the time of completion of the immersion was not less than 5 mm and the part of the seed crystal to be immersed in the melt had been machined and when the maximum value of the temperature gradient occurring in the seed crystal was more than 10° C./mm, the immersing rate of the seed crystal in the melt was more than 2.8 mm/min, the leading end of the seed crystal was not convexed downward, the Rmax value of the part of the seed crystal (reference length 0.1 mm) to be immersed in the melt was more than 5.0 $\mu$m, and the dopant concentration in the seed crystal was less than $1\times10^{17}$ cm$^{-3}$ as described above, the growth of the silicon single crystal in a dislocation-free state was difficult to attain.

Comparative Example 2

In the apparatus of FIG. 1, a seed crystal was immersed in the melt under the following conditions.

Presence or absence of dislocation in seed crystal: absent

Maximum value of temperature gradient occurring in seed crystal: 15° C./mm

Immersing rate into melt: 3.0 mm/min

Shape of leading end of seed crystal: flat

Rmax value of part of seed crystal (reference length 0.1 mm) immersed in melt: 5.4 μm Surface condition of part of seed crystal immersed in melt: as ground Dopant concentration in seed crystal: boron=$5\times10^{15}$ cm$^{-3}$ Horizontal maximum length of part of seed crystal being immersed in melt at time of completion of immersion: 20 mm After the immersion of the seed crystal was completed and the crystal was fully wetted with the melt, the main body part of silicon single crystal was grown with no recourse to the Dash's neck.

The silicon single crystal thus grown was in a dislocated state.

Even if the horizontal maximum length of the part of the seed crystal being immersed in the melt of silicon at the time of completion of the immersion was not less than 5 mm and the part of the seed crystal to be immersed in the melt had been machined and when the maximum value of the temperature gradient occurring in the seed crystal was more than 10° C./mm, the immersing rate in the melt was more than 2.8 mm/min, the leading end of the seed crystal was not convexed downward, the Rmax value of the part of the seed crystal (reference length 0.1 mm) to be immersed in the melt was more than 5.0 μm, and the dopant concentration in the seed crystal was less than $1\times10^{17}$ cm$^{-3}$ as described above, the growth of the silicon single crystal in a dislocation-free state was difficult to attain.

While there have been shown and described present preferred examples of the invention, it is to be understood that the invention is not limited by the description of these examples.

The entire disclosures of Japanese Patent Application No. 9-152246 filed on Jun. 10, 1997 and No. 10-143072 filed on May 25, 1998 including specification, claims, drawings and summary are incorporated herein by reference in its entirety.

What is claimed is:

1. A method for the production of a dislocation-free silicon single crystal by the Czochralski method, which allows growth of a main body part of the dislocation-free silicon single crystal by immersing a seed crystal formed of dislocation-free silicon single crystal in a melt of silicon and thereafter pulling said seed crystal without recourse to necking, said production being effected under the following conditions:

(a) a horizontal maximum length of the part of said seed crystal being immersed in said melt of silicon at the time of completion of said immersion is not less than 5 mm;

(b) the part of said seed crystal to be immersed in said melt of silicon has been shaped by machining; and (c) at least any one condition selected from the group consisting of the following conditions (c1) through (c6) is satisfied;

(c1) a leading end of the part of said seed crystal to be immersed in said melt of silicon is convexed downward;

(c2) a Rmax value of surface roughness of the part of said seed crystal to be immersed in said melt of silicon is not more than 5 μm, based on the reference length of 0.1 mm;

(c3) the part of said seed crystal to be immersed in said melt of silicon has been etched;

(c4) a concentration of a dopant contained in said seed crystal is not less than $1\times10^{17}$ cm$^{-3}$;

(c5) an immersing rate of said seed crystal in said melt of silicon is not more than 2.8 mm/min; and (c6) a temperature gradient occurring in said seed crystal is not more than 10° C./mm during the growth of the silicon single crystal.

2. A method according to claim 1, wherein said seed crystal is such that an angle of leading end/10 mm thereof is an acute angle.

3. A method according to claim 2, wherein the shape of the leading end of the part of said seed crystal to be immersed in said melt of silicon is symmetrical relative to the crystal central axis.

4. A method according to claim 3, wherein the shape of the leading end of the part of said seed crystal to be immersed in said melt of silicon is conical.

5. A method according to claim 1, wherein a shape of the leading end of the part of said seed crystal to be immersed in said melt of silicon is symmetrical relative to the crystal central axis.

6. A method according to claim 5, wherein the shape of the leading end of the part of said seed crystal to be immersed in said melt of silicon is conical.

7. A method for the production of a dislocation-free silicon single crystal by the Czochralski method, which allows growth of a main body part of the dislocation-free silicon single crystal by immersing a seed crystal formed of dislocation-free silicon single crystal in a melt of silicon and thereafter pulling said seed crystal without recourse to necking, said production being effected under the following conditions:

(a) a horizontal maximum length of the part of said seed crystal being immersed in said melt of silicon at the time of completion of said immersion is not less than 5 mm; and (b) at least any one condition selected from the group consisting of the following conditions (b1) through (b6) is satisfied;

(b1) a part of said seed crystal to be immersed in said melt of silicon is as grown;

(b2) a leading end of the part of said seed crystal to be immersed in said melt of silicon is convexed downward;

(b3) a Rmax value of surface roughness of the part of said seed crystal to be immersed in said melt of silicon is not more than 5 μm, based on the reference length of 0.1 mm, (b4) a concentration of a dopant contained in said seed crystal is not less than $1\times10^{17}$ cm$^{-3}$;

(b5) an immersing rate of said seed crystal in said melt of silicon is not more than 2.8 mm/min; and (b6) a temperature gradient occurring in said seed crystal is not more than 10° C./mm during the growth of the silicon single crystal.

8. A method according to claim 7, wherein the part of said seed crystal to be immersed in said melt of silicon has been grown by the MCZ method.

9. A method according to claim 7, wherein said seed crystal is such that the angle of leading end/10 mm thereof is an acute angle.

10. A method according to claim 9, wherein the shape of the leading end of the part of said seed crystal to be immersed in said melt of silicon is symmetrical relative to the crystal central axis.

11. A method according to claim 8, wherein the shape of the leading end of the part of said seed crystal to be immersed in said melt of silicon is conical.

12. A method according to claim 7, wherein the shape of the leading end of the part of said seed crystal to be immersed in said melt of silicon is symmetrical relative to the crystal central axis.

13. A method according to claim 12, wherein the shape of the leading end of the part of said seed crystal to be immersed in said melt of silicon is conical.

* * * * *